United States Patent [19]

Regnault

[11] Patent Number: 4,995,546

[45] Date of Patent: Feb. 26, 1991

[54] DEVICE MOUNTING

[75] Inventor: John C. Regnault, Woodbridge, England

[73] Assignee: BT&D Technologies Limited, England

[21] Appl. No.: 424,236

[22] PCT Filed: Mar. 31, 1989

[86] PCT No.: PCT GB/00332

§ 371 Date: Oct. 18, 1989

§ 102(e) Date: Oct. 18, 1989

[87] PCT Pub. No.: WO89/09491

PCT Pub. Date: Oct. 5, 1989

[30] Foreign Application Priority Data

Mar. 31, 1988 [GB] United Kingdom ................ 8807729

[51] Int. Cl.$^5$ .................. H01L 21/60; H01S 3/02; B23K 101/40

[52] U.S. Cl. .................................. 228/123; 228/124; 228/180.2; 228/190; 228/208; 228/254

[58] Field of Search .................. 228/123, 124, 180.2, 228/190, 208, 254

[56] References Cited

U.S. PATENT DOCUMENTS

| 3,922,775 | 12/1975 | Potter | 228/123 |
| 4,389,557 | 6/1983 | Devenyi et al. | 228/123 |
| 4,465,223 | 8/1984 | Cammarano et al. | 228/123 |
| 4,772,935 | 9/1988 | Lawler et al. | 228/124 |
| 4,817,849 | 4/1989 | Yamamoto et al. | 228/123 |
| 4,875,617 | 10/1989 | Citowsky | 228/254 |

FOREIGN PATENT DOCUMENTS

| 37114 | 11/1975 | Japan | 228/123 |
| 190768 | 11/1982 | Japan | 228/123 |

Primary Examiner—Sam Heinrich
Attorney, Agent, or Firm—Nixon & Vanderhye

[57] ABSTRACT

A technique for assembling semiconductor devices in which semiconductor elements, especially lasers or LEDs, are mounted on a first packaging element such as a heat spreader that is mounted on a second packaging element such as a heat sink. Handling of solder preforms is avoided by coating at least one of each of the pairs of surfaces to be brought into contact with a layer of solder and heating the assembly to melt both solder layers in a single operation. In a preferred embodiment a heat spreader is coated in solder on both sides and interposed between a semiconductor element and a heat sink and the assembly is heated. Molybdenum may be used as a layer to aid wetting and adhesion and gold/tin solder may be used. Slightly different solidification temperatures and compositons for the layers may result from different take up of metallization layers from the components into the solder.

12 Claims, No Drawings

DEVICE MOUNTING

This invention relates to the mounting of devices and is especially applicable to bonding devices such as lasers to heat sinks.

Many devices are attached to heat sinks for thermal stability and heat dissipation, but for devices such as semiconductor lasers that dissipate large amounts of power over a very small surface area (typically a few hundred microns by tens of microns) it is usually necessary to bond the device to a high conductivity heat spreader such as diamond which is then in turn bonded to a heat sink. The bonding process is a crucial stage for satisfactory device life and it is necessary for the bond to exhibit good thermal conductivity. It is also important for the bond to exhibit good mechanical stability and for the bonding process to cause minimal or no change to the actual device. For reasons of mechanical stability, which in an optical communications system may need to be of the order of less than one micron over a period of 25 years, it is not possible to use many of the soft solders because these are subject to creep. Also, as there are two soldering stages of heat sink to heat spreader and device to heat spreader it is necessary to ensure that the soldering stages do not interfere with one another.

The current state of the art procedure is for the heat sink and heat spreader to be bonded together in a first step and for the device to be soldered to the heat spreader subsequently using a lower melting temperature solder so that the first solder joint is not remelted. The heat sink and heat spreader are usually bonded together with an 88 weight percent gold 12 weight percent germanium alloy which is a eutectic composition with a melting temperature of 356 degrees centigrade. In order to facilitate adhesion the components are usually plated with gold, or nickel then gold, the nickel preventing diffusion of copper (which is a common material for the heat sink) into the solder layer. The solder is usually a preform that is lain onto the heat sink, the heat spreader is laid on top, and the assembly heated until the solder melts, usually about 10 to 20 seconds. During the melted stage the solder interacts with the gold layers on the sink and spreader and so the resulting solidified solder layer is therefore slightly off the eutectic composition.

Bonding of the device chip to the spreader then takes place in a similar way using a preform of 80 wt% gold 20 wt% tin solder that melts at 282 degrees centigrade. The spreader and chip are usually plated with titanium and then gold, often with an intervening barrier layer of platinum, in order to aid adhesion.

The problem with such a bonding procedure is that it is laborious and involves difficult handling stages: in particular the solder preforms are only of the order of 10 to 12 microns in thickness with their other dimensions slightly smaller than the smallest adjacent component so that after melting and spreading it is of the same size as the smallest adjacent component.

The present invention is directed towards enabling a simpler bonding procedure and eliminating the need for solder preform handling.

Accordingly the invention provides in a first aspect a method of manufacturing a semiconductor device having a semiconductor element bonded to a first surface of a first package element and a second surface of the first package element bonded to a second package element, the method comprising applying a layer of solder to the first surface of the first package element, applying a solder layer to at least one of the second surface of the first package element and the second package element, interposing the first package element between the semiconductor element and the second package element and applying heat to melt the solder layers and bond the semiconductor element and second package element to the first package element in a single heating operation.

According to a second aspect the invention provides a method of manufacturing a semiconductor device having a semiconductor element bonded to a first surface of a first package element and a second surface of the first package element bonded to a second package element, the method comprising the steps of: applying a first layer of solder to the first surface of the first package element, applying a second layer of solder to at least one of the second surface of the first package element and the second package element, the first and second solder layers each having substantially the same melting point; positioning the first package element with respect to the second package element; positioning the semiconductor element with respect to the first package element; applying heat to melt the second solder layer; and applying heat to melt the first solder layer; whereby the semiconductor element and the second package element are bonded to the first package element.

In order to eliminate the need for handling preforms the present invention proposes coating the heat spreader with solder. The problems encountered in satisfactorily achieving this and a good solder bond are various. Firstly the gold-tin alloy was sputtered on to a titanium/platinum/gold plated diamond heat sink. However during the bonding process the solder interacted with the plating metallisation so that the solder became unsatisfactory. A similar procedure was attempted using diamond heat spreaders coated only with platinum but again an unsatisfactory mixture of ternary gold/tin/platinum occurred. A search for suitable materials to aid adhesion to the heat sink and not significantly migrate into the solder during the melting stage resulted in selection of molybdenum as a preferred coating for the heat sink. However once the upper surface of the heat sink is coated with gold/tin solder to avoid having to use the small preform it is then not possible to use a solder of higher melting temperature for the lower solder layer, and thus it is not possible to use the usual germanium/gold solder. This could be overcome by soldering the heat spreader to the heat sink first, but this is not desirable from a mass production point of view since it would mean more sputtering stages because only a comparatively small number of mounted heat spreaders could be coated in a single operation. Another option available would be to thermo-compression bond the coated spreader to the heat sink using a temperature of about 250 degrees centigrade, but this process is not reliably reproducible there being a tendency to affect the gold/tin solder surface.

The present invention departs from the established two-stage bonding process by forming both bonds at the same time, thereby eliminating the necessity for different melting temperature solders. In a preferred method and embodiment a heat spreader is coated on both sides with a barrier layer that aids adhesion and wetting by solder, molybdenum is particularly suitable for this, and then both sides of the coated heat spreader are coated with solder, an 80 weight percent gold 20 weight percent tin solder being preferred. Typically the molybdenum layer is about 0.25 μm, thick. Typically the solder layers are each about 2.5 μm thick. This solder coated heat spreader is then interposed between a heat sink and device chip, held in position, and heated via the heat sink for about 15 seconds to melt both solder layers. The heat sink, which may be a packaging header or a separate block, is gold plated in the usual manner to a thickness of about one micron, and so when the solder between the heat spreader and heat sink melts the solder takes up some of that gold and solidifies as a non-eutectic paste. This can be tolerated in this location as residual stresses here will not affect device performance. There is usually metallisation on the device chip surface, typically a 0.3 micron layer of gold and so the top solder layer is not able to take up as much gold as the lower layer (since there is less available) and thus it solidifies at or closer to the eutectic composition and remains substantially stress free. In practice it is possible to remove the collet that is used to hold the chip in position and cease heating as soon as the upper layer has melted.

Of course it is not essential for the solder used to be of eutectic composition. Acceptable results may be achieved with alloy compositions a few weight percent to either side of the eutectic composition, provided that after heating, the solder between the heat sink and the heat spreader has a higher melting point than the solder provided on the surface of the heat spreader remote from the heat sink. The limits to solder composition are of course dependent on the heat sensitivity of the components of the assembly: normally the semiconductor device will be the most temperature sensitive component. The ease and extent to which the significant solder portions pick up alloying elements e.g. gold, during the soldering process are also significant. Attention should therefore be paid to the composition and thickness of the surface metallisation of the heat sink and the semiconductor device. It is likely that for the gold tin solders a gold content of at least 70 weight percent is required, the upper limit on gold content being determined by the maximum permissible soldering temperature, and almost certainly being less than 83 weight percent. If a gold tin solder is used the gold content preferably is between 75 weight percent and 82 weight percent.

Although this procedure requires the heat spreaders to be coated, it is possible to coat very large numbers of spreaders in a single operation, turn them over and coat the other side. Once this is done all subsequent assembly stages are simplified: instead of handling three components and two delicate solder preforms and performing two separate heating stages no preforms need to be handled and only one heating stage is required. A particular advantage of the procedure is that it maybe readily automated for mass production with the coated heat spreaders stacked in and dispensed from a hopper. If the solder melting stage is performed very quickly it may be possible in some applications to omit a barrier/wetting layer on the heat spreader.

I claim:

1. A method of manufacturing a semiconductor device having a semiconductor element bonded to a first surface of a first package element and a second surface of the first package element bonded to a second package element, the method comprising:
    applying a layer of fusible alloy solder to the first surface of the first package element,
    applying a fusible alloy solder layer to at least one of the second surface of the first package element and a second package element surface which is to be bonded to the first package element,
    interposing the first package element between the semiconductor element and the second package element, and
    applying heat to melt the fusible alloy solder layers and bond the semiconductor element and second package element to the first package element in a single heating operating.

2. A method according to claim 1 in which the solder is a gold and tin solder.

3. A method according to claim 1 in which the semiconductor element and at least one of the second surface of the first package element and the second package element surface bonded thereto further comprises a gold layer.

4. A method of manufacturing a semiconductor device having a semiconductor element bonded to a first surface of a first package element and a second surface of the first package element bonded to a second package element, the method comprising the steps of:
    applying a first layer of fusible alloy solder to the first surface of the first package element,
    applying a second layer of fusible alloy solder to at least one of the second surface of the first package element and a second package element surface which is to be bonded to the first package element the first and second fusible alloy solder layers each having substantially the same melting point;
    positioning the first package element second surface adjacent the second package element surface to be bonded thereto;
    positioning the semiconductor element first surface adjacent the first package element;
    applying heat to melt the second solder layer; and
    applying heat to melt the first solder layer; whereby the semiconductor element and the second package element are bonded to the first package element.

5. A method as claimed in claim 4 wherein the first and second solder layers are melted to effect bonding of the semiconductor element and the second package element to the first package element in a single heating operation.

6. A method as claimed in claim 4 wherein the first and second solder layers are applied respectively to the first and second surfaces of the first package element, and wherein the surface of said semiconductor element to which said first surface is to be bonded and the surface of the second package element to which said second surface is to be bonded each have at least a surface of a material which is readily absorbable by the respective solder layer when the solder is in a molten state, whereby during the heat bonding step or steps the composition or compositions of the solder layers changes with a consequent change in liquidus temperature.

7. A method of manufacturing a semiconductor device having a semiconductor element bonded to a first surface of a first package element and a second surface of the first package element bonded to a second package element, the method comprising the steps of:
    applying a first layer of solder to the first surface of the first package element,
    applying a second layer of solder to at least one of the second surface of the first package element and a second package element surface which is to be bonded to the first package element, the first and second solder layers each having substantially the same melting point;

positioning the first package element second surface adjacent the second package element surface to be bonded thereto;

positioning the semiconductor element first surface adjacent the first package element;

applying heat to melt the second solder layer;

applying heat to melt the first solder layer; whereby the semiconductor element and the second package element are bonded to the first package element;

wherein the first and second solder layers are applied respectively to the first and second surfaces of the first package element, and wherein the surface of said semiconductor element to which said first surface is to be bonded and the surface of the second package element to which said second surface is to be bonded each have at least a surface of a material which is readily absorbable by the respective solder layer when the solder is in a molten state, whereby during the heat bonding step or steps the composition or compositions of the solder layers changes with a consequent change in liquidus temperature; and wherein the first and second solder layers have substantially the same composition prior to bonding, the thickness of said readily absorbable material on said surface of said semiconductor device being substantially less than on said surface of the second package element, whereby in the bonded process less of said readily absorbable material is absorbed by said first solder layer than by said second solder layer, such that after bonding the second solder layer has a higher liquidus temperature than said first solder layer.

8. A method as claimed in claim 4 wherein the first and second solder layers each have compositions at or close to a eutectic composition.

9. A method as claimed in claim 6, wherein the first and second solder layers each comprise a gold tin solder, and wherein said readily absorbable material is gold.

10. A method according to claim 4 in which the first package element is a heat spreader and the second package element is a heat sink.

11. A method according to claim 4 in which a layer is deposited on said first and second surfaces of the first package element prior to the solder application that aids adhesion and wetting by the solder.

12. A method according to claim 11 in which said layer comprises molybdenum.

* * * * *